US009894810B2

(12) United States Patent
Gauthier et al.

(10) Patent No.: US 9,894,810 B2
(45) Date of Patent: Feb. 13, 2018

(54) MODULARIZATION OF DATA CENTER FUNCTIONS

(71) Applicant: Microsoft Technology Licensing, LLC, Redmond, WA (US)

(72) Inventors: David Thomas Gauthier, Seattle, WA (US); Scott Thomas Seaton, Kirkland, WA (US); Allan Joseph Wenzel, Seattle, WA (US); Cheerei Cheng, Newcastle, WA (US); Brian Clark Andersen, Kent, WA (US); Daniel Gerard Costello, Redmond, WA (US); Christian L. Belady, Mercer Island, WA (US); Jens Conrad Housley, Hillsboro, OR (US); Brian Jon Mattson, Redmond, WA (US); Stephan W. Gilges, Portland, OR (US); Kenneth Allen Lundgren, Portland, OR (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/058,146

(22) Filed: Mar. 1, 2016

(65) Prior Publication Data

US 2016/0338229 A1     Nov. 17, 2016

Related U.S. Application Data

(60) Continuation of application No. 13/292,215, filed on Nov. 9, 2011, now abandoned, which is a division of
(Continued)

(51) Int. Cl.
*H05K 7/20*     (2006.01)
*H02J 9/06*     (2006.01)
(Continued)

(52) U.S. Cl.
CPC ......... *H05K 7/20781* (2013.01); *G06F 1/182* (2013.01); *G06F 1/189* (2013.01);
(Continued)

(58) Field of Classification Search
CPC ................................................... H05K 7/1497
See application file for complete search history.

(56) References Cited

U.S. PATENT DOCUMENTS

| 4,992,669 A | 2/1991 | Parmley |
| 6,185,098 B1 | 2/2001 | Benavides |

(Continued)

OTHER PUBLICATIONS

"Ice Cube Modular Data Center", Retrieved From https://web.archive.org/web/20081219223952/http://www.rackable.com/products/icecube.aspx>, Dec. 3, 2008, 2 Pages.
(Continued)

*Primary Examiner* — Robert J Hoffberg
(74) *Attorney, Agent, or Firm* — Liang IP, PLLC (57) ABSTRACT

In one example, a data center may be built in modular components that may be pre-manufactured and separately deployable. Each modular component may provide functionality such as server capacity, cooling capacity, fire protection, resistance to electrical failure. Some components may be added to the data center by connecting them to the center's utility spine, and others may be added by connecting them to other components. The spine itself may be a modular component, so that spine capacity can be expanded or contracted by adding or removing spine modules. The various components may implement functions that are part of standards for various levels of reliability for data centers. Thus, the reliability level that a data center meets may be increased or decreased to fit the circumstances by adding or removing components.

20 Claims, 7 Drawing Sheets

Related U.S. Application Data application No. 12/395,556, filed on Feb. 27, 2009, now Pat. No. 8,077,457.

(51) Int. Cl.
*H05K 7/14* (2006.01)
*G06F 1/18* (2006.01)
*G06F 1/30* (2006.01)

(52) U.S. Cl.
CPC ............... *G06F 1/30* (2013.01); *H02J 9/061* (2013.01); *H05K 7/1492* (2013.01); *H05K 7/1495* (2013.01); *H05K 7/1497* (2013.01); *H05K 7/2079* (2013.01); *Y10T 29/49002* (2015.01)

(56) References Cited

U.S. PATENT DOCUMENTS

| | | | |
|---|---|---|---|
| 6,967,283 B2 | 11/2005 | Rasmussen et al. | |
| 7,020,586 B2 | 3/2006 | Snevely | |
| 7,278,273 B1 | 10/2007 | Whitted et al. | |
| 7,365,973 B2 | 4/2008 | Rasmussen et al. | |
| 7,437,437 B2 | 10/2008 | Kennedy | |
| 7,511,959 B2 | 3/2009 | Belady et al. | |
| 7,511,960 B2 | 3/2009 | Hillis et al. | |
| 7,551,971 B2 | 6/2009 | Hillis | |
| 7,672,590 B2 | 3/2010 | Niedrich et al. | |
| 7,688,578 B2 | 3/2010 | Mann et al. | |
| 7,724,513 B2 | 5/2010 | Coglitore et al. | |
| 7,738,251 B2 | 6/2010 | Clidaras et al. | |
| 7,852,627 B2 | 12/2010 | Schmitt et al. | |
| 7,893,567 B1 | 2/2011 | Deros et al. | |
| 7,894,945 B2 | 2/2011 | Hillis | |
| 7,895,855 B2 | 3/2011 | Gooch | |
| 8,077,457 B2* | 12/2011 | Gauthier ................. G06F 1/182 165/104.33 |
| 8,218,322 B2* | 7/2012 | Clidaras .................... G06F 1/20 165/80.4 |
| 8,270,154 B2* | 9/2012 | Andersen ........... H05K 7/20745 361/679.47 |
| 8,549,869 B1* | 10/2013 | Whitted .................... G06F 1/16 165/104.33 |
| 8,743,543 B2* | 6/2014 | Clidaras .................... G06F 1/20 165/80.4 |
| 9,301,432 B2* | 3/2016 | Nelson .................. F24F 1/0059 |
| 9,565,783 B1* | 2/2017 | Whitted .................... G06F 1/16 |
| 2007/0103325 A1 | 5/2007 | Wagner et al. | |
| 2008/0055846 A1 | 3/2008 | Clidaras et al. | |
| 2008/0064317 A1 | 3/2008 | Yates et al. | |
| 2008/0094797 A1 | 4/2008 | Coglitore et al. | |
| 2008/0123288 A1 | 5/2008 | Hillis | |
| 2008/0180908 A1 | 7/2008 | Wexler | |
| 2008/0270572 A1 | 10/2008 | Belady et al. | |
| 2008/0291626 A1 | 11/2008 | Nelson et al. | |
| 2009/0031547 A1 | 2/2009 | Belady et al. | |
| 2009/0229194 A1* | 9/2009 | Armillas ............... E04H 1/1205 52/79.1 |
| 2010/0165565 A1 | 7/2010 | Hellriegal et al. | |
| 2010/0188810 A1 | 7/2010 | Andersen et al. | |
| 2012/0055012 A1 | 3/2012 | Gauthier et al. | |

OTHER PUBLICATIONS

"The Collaborative Engineers", Retrieved From https://web.archive.org/web/20080428024200/http://www.col-laborativeengineers.com/datacenter.html, Retrieved on: Dec. 4, 2008, 4 Pages.

"Non Final Office Action Issued in U.S. Appl. No. 12/395,556", dated Mar. 9, 2011, 9 Pages.

"Notice of Allowance Issued in U.S. Appl. No. 12/395,556", dated Aug. 30, 2011, 7 Pages.

"Notice of Allowance Issued in U.S. Appl. No. 12/395,556", dated Oct. 4, 2011, 4 Pages.

"Final Office Action Issued in U.S. Appl. No. 13/292,215", dated Nov. 20, 2013, 6 Pages.

"Final Office Action Issued in U.S. Appl. No. 13/292,215", dated Mar. 5, 2015, 7 Pages.

"Non Final Office Action Issued in U.S. Appl. No. 13/292,215", dated Jul. 24, 2014, 9 Pages.

"Non Final Office Action Issued in U.S. Appl. No. 13/292,215", dated Mar. 19, 2013, 7 Pages.

Al-Fares, et al., "A Scalable, Commodity Data Center Network Architecture", In Proceedings of the ACM SIGCOMM Conference on Data Communication, Aug. 17, 2008, pp. 63-74.

Botelho, Bridget, "HP's POD: The Newest Containerized Data Center", Retrieved From <<http://searchdatacenter.techtarget.com/news/1321416/HPs-POD-The-newest-containerized-data-center>>, Jul. 16, 2008, 4 Pages.

Hamilton, James, "An Architecture for Modular Data Centers", In Proceedings of Third Biennial Conference on Innovative Data Systems Research, Jan. 7, 2007, 8 Pages.

Hoover, J. Nicholas, "Microsoft to Mainstream Containerized Data Centers with C-Biox", Retrieved From <<http://www.informationweek.com/microsoft-to-mainstream-containerized-data-centers-with-c-blox/d/d-id/1066582?>>, Apr. 8, 2008, 9 Pages.

Salwan, Sam, "Data Center Fire Suppression", Retrieved From <<https://web.archive.org/web/20081202010018/http://www.csemag.com/article/CA6562632.html>>, May 1, 2008, 3 Pages.

* cited by examiner

MODULARIZATION OF DATA CENTER FUNCTIONS

CROSS-REFERENCE

This is a continuation of U.S. patent application Ser. No. 13/292,215, filed Nov. 9, 2011, entitled "Modularization of Data Center Functions," which is a division of U.S. patent application Ser. No. 12/395,556, filed Feb. 27, 2009, entitled "Modularization of Data Center Functions," now U.S. Pat. No. 8,077,457 issued on Dec. 13, 2011.

BACKGROUND

A data center is a facility that houses computer equipment and related components. Data centers typically include many server computers and the auxiliary equipment that is used to keep the servers running. The servers in data centers are used to host various functions, such as web applications, e-mail accounts, enterprise file servers, etc.

A data center is not merely a building in which servers are stored and operated. In addition to computing and data storage resources, data centers provide resistance to certain types of failures. A given data center may be expected to remain functional for some amount of time in the event of a power failure, may be expected to operate regardless of temperature or other weather conditions, and may be expected to implement some level of physical security and resistance to fire or natural disasters. There may be various other types of expectations placed on a data center. Thus, in addition to housing the computer equipment that performs the data center's core function of providing the computing resources to host applications, a data center also typically houses power backup equipment (e.g., backup generators, uninterruptable power supplies, etc.), cooling equipment, fire protection equipment, etc.

Data centers are scalable in a number of different senses. One way in which a data center may be scaled is to increase or decrease the computing capacity of the data center—e.g., by increasing or decreasing the number of server machines at the data center. However, other types of scalability relate to the expectations placed on the data center. Data centers may meet various different performance and reliability standards—sometimes referred to as "levels"—and one sense in which a data center may be scaled is to modify the data center to meet higher or lower performance or reliability standards. For example, one level may involve some amount of backup power and cooling equipment, and another level may involve a different amount of backup power and cooling equipment and, perhaps, some fire resistance or increased security that is not present in the first level.

Data centers may be modularized and expandable. For example, a self-contained group of servers may be put in a movable container (e.g., a shipping container or modular enclosure) along with the power equipment, cooling equipment, etc., involved in operating those servers. These modules may be pre-fabricated and then moved to the location at which the data center is to be installed. If it is decided to increase the capacity of the data center, an additional module may be added.

While it is possible to modularize data centers to increase their size or capacity, individual functionalities generally have not been modularized. In some cases, there may be reason to increase or decrease some particular functionality of a data center—e.g., the center's resistance to fire, power failure or adverse weather conditions.

SUMMARY

Modules may be created to implement various functionalities of a data center. Data centers may be created or modified by adding or removing the modules in order to implement these functionalities. There may be modules that contain servers, modules that contain cooling equipment, modules that contain backup generators, modules that contain Uninterruptable Power Supplies (UPSs), modules that contain electrical distribution systems or modules that implement any other type (or combination) of functionality. These modules may be combined in order to build a data center that meets certain expectations. There may be a utility spine that connects certain types of modules to power, telecommunications cabling, cooling media such as chilled water, air, glycol, etc. One way to expand a data center's functionality is to attach additional modules (e.g., server modules) to the spine. Another way to expand the data center's functionality is to attach modules to other modules—e.g., a cooling module could be attached to a server module, in order to provide increased cooling capacity or tighter temperature/humidity control to the servers in that server module.

For example, a particular number of server modules may be chosen based on the expected capacity of the data center. If the data center is expected to maintain cooling within a certain temperature and humidity boundary, then cooling modules can be added. If the data center is expected to implement a certain level of resistance to interruptions of electrical service, then generator modules, UPS modules and/or electrical distribution modules may be added. If the data center is expected to implement a certain level of resistance to interruption of networking connectivity, telecommunications modules may be added. Modules may be combined in any way in order to implement any type of functional expectations.

Similarly, if conditions change such that functionality can be removed from the data center, then the modules can be removed. For example, if the expected demand on the data center abates, then modules that contain servers can be removed, thereby reducing the capacity of the data center. If conditions change such that it can be tolerated for the data center to be less resistant to power disruptions, then generator and/or UPS modules can be removed. Or, if the amount of power that the servers draw is reduced due to technological shifts, then power components could be removed. In general, modularization of the various functionalities of a data center allows a data center to be adapted continually to greater or lesser expectations regarding its functionality.

Standards that data centers are expected to meet are often quantized into levels. Modularization of functionality allows data centers to be modified to satisfy the specifications of different levels. For example, in order to upgrade a data center from one level to the next, modules that increase the data center's resistance to fire, power disruption, temperature excursions, etc., may be added.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Many types of computing are performed at data centers, which host large numbers of fast computers and storage devices. For example, web hosting, e-mail hosting, data warehouses, etc., are implemented at data centers. The data centers typically contain large numbers of server computers and network devices, which run applications to perform various functions. In the recent past, computing was largely a local affair, with most functions being performed on a local desktop or laptop computer located in the same place as the computer user. With the growth of network connectivity, the increased use of handheld computers, and the rise of usage models such as cloud computing, the amount of functionality performed at data centers has increased and, likely, will continue to increase. With increased demands on capacity for data centers, there is pressure to be able to deploy data centers quickly, at low cost, and in ways that satisfy the (possibly changing) demands being placed on the center.

One technology for building data centers that has drawn interest in recent years is the pre-fabricated data center. Such a data center may be assembled at a factory in units that may be delivered to wherever they are to be used. For example, racks of servers could be installed in a shipping container along with cooling components, fire-protection components, etc., and the container could be delivered to the site on which a data center is to be built. Typically, the pre-fabrication of data center units allows data centers to be built to scale, but does not allow fine-grained control over the functionality of the data center. For example, if each container can provide a capacity of N, and a data center is to have a capacity of 5N, then five shipping containers could be delivered to the site at which the data center is to be built, and the shipping containers could be connected to power utilities, data utilities, cooling equipment, etc., at a single site in order to provide a data center with the intended capacity. Certain specific types of components could be added to augment functionality—e.g., cooling equipment could be added to an existing unit in order to allow the data center to operate in a hotter climate or at a higher power level.

However, pre-fabrication technology typically does not typically allow functionality to be added to the data center in a custom manner that is tailored to the particular expectations that apply to a particular data center. For example, there may be various standards of reliability for data centers at certain levels, and the particular level rating of a data center may be based on the data center's having certain functionalities. Thus, a level 2 data center might have a certain amount of resistance to fire, power failures, etc., and a level 3 data center might have different amounts of those features. So, converting a level 2 data center to a level 3 data center might involve adding more backup power, fire protection equipment, etc., than would be present in a level 2 data center.

Another issue is that the amount of scale that can be achieved with pre-fabrication technology may be limited by the size of the utility spine that is used to provide certain services (e.g., power, data, cooling media, etc.) to individual units. Thus, a common spine might be able to support six server containers, so installation of another server container might involve installing a new spine.

The subject matter described herein may be used to modularize the functionality of a data center. Individual functionalities (e.g., backup power, cooling, fire protection, electrical switch gear, electrical switch boards, electrical distribution, air-cooling, generator, UPS, chilled water central plant, cooling towers, condensers, dry coolers, evaporative cooler, telecommunications main distribution (MDF), telecommunication intermediate distribution (IDF), storage, office, receiving and/or loading dock, security, etc.) may be implemented as modules. The modules can be combined to build a data center having a certain capacity, or having certain properties (e.g., a certain level of resistance to power outage, fire, etc.). The utility spine that serves individual modules may, itself, be modularized, so that the spine can be made larger (or smaller) by adding (or removing) spine modules. In this way, a data center can be built to have scale and functional capabilities appropriate to the circumstances in which the data center is built, and the scale and capabilities can be added or removed at will. By allowing data center builders to pick and choose the scale and functionality appropriate for a situation, waste that results from excess capacity or excess capabilities may be avoided. Additionally, the modularity of the components allows the data center to evolve even after it has been deployed, since components may be added or removed even after the data center as a whole has become operational.

Additionally, with regard to reliability levels, capabilities may be added (or removed) in order to change (e.g., increase or reduce) the reliability level at which a given data center is rated. That is, if a level 2 data center exists and a level 3 data center is called for, modules can be added to increase the capabilities of the data center to level 3. If the level 3 data center is no longer called for, modules can be removed to reduce the reliability level of the data center (and those modules may be installed in a different data center, thereby making effective re-use of existing components).

Figure 1:
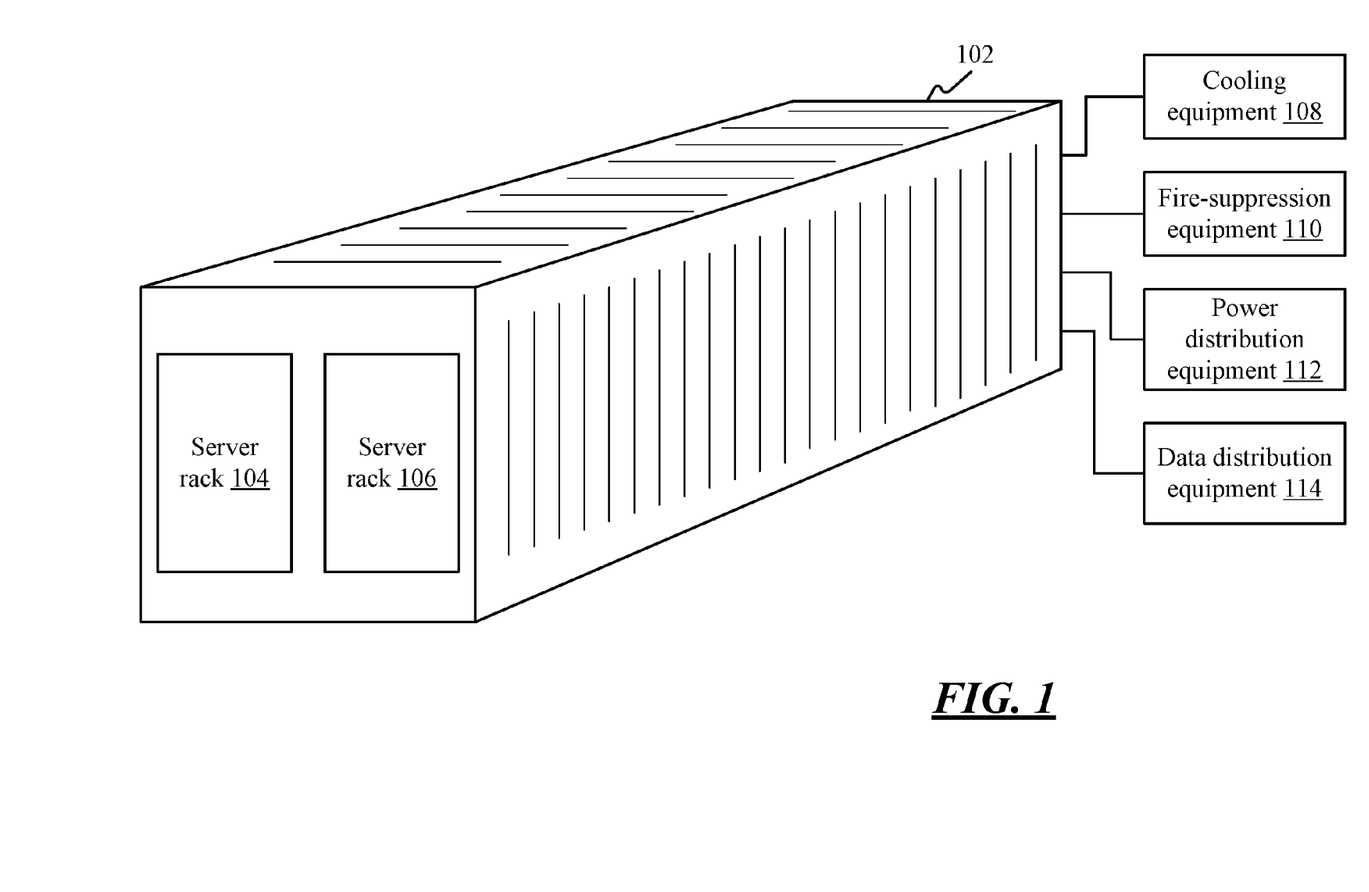
FIG. 1 is a perspective view of an example module that may be used in building a data center.

Turning now to the drawings, FIG. 1 shows an example module 102. In the example of FIG. 1, module 102 is a server module, which contains racks of server machines (e.g., racks 104 and 106, as well as, possibly, additional racks that are inside the module behind its walls in the view of FIG. 1). The server machines contained in racks 104 and 106 may be used to host various types of functionalities. For example, these servers may host web site, E-mail servers, enterprise document servers, etc.

In addition to the servers themselves, module 102 may have various other types of equipment that is used in the course of operating the servers. For example, module 102 may include: cooling equipment 108 to keep the servers cool; fire protection equipment 110 with smoke detection, dry foam, carbon dioxide gas, sprinkler, etc., to detect and/or extinguish fires; power distribution equipment 112 to distribute power to the servers; data distribution equipment 114 to connect the servers to a network; or any other type of equipment. (Any of the equipment mentioned above, or other elements, could be implemented as separate modules, or any one or more of the components could be implemented together as an integrated module.)

In one example, module 102 may take the form of a shipping container. Thus, racks of servers, and the various auxiliary equipment used in the course of operating those servers, may be assembled in a shipping container and transported to any location in the world. However, module 102 could take any form, of which a shipping container is merely one example.

While module 102 is described above as a server module, module 102 could also be a data storage module (which may implement data storage functionality), a networking module (which may implement network communication functionality), or any other type of module that implements any other type of functionality.

Figure 2:
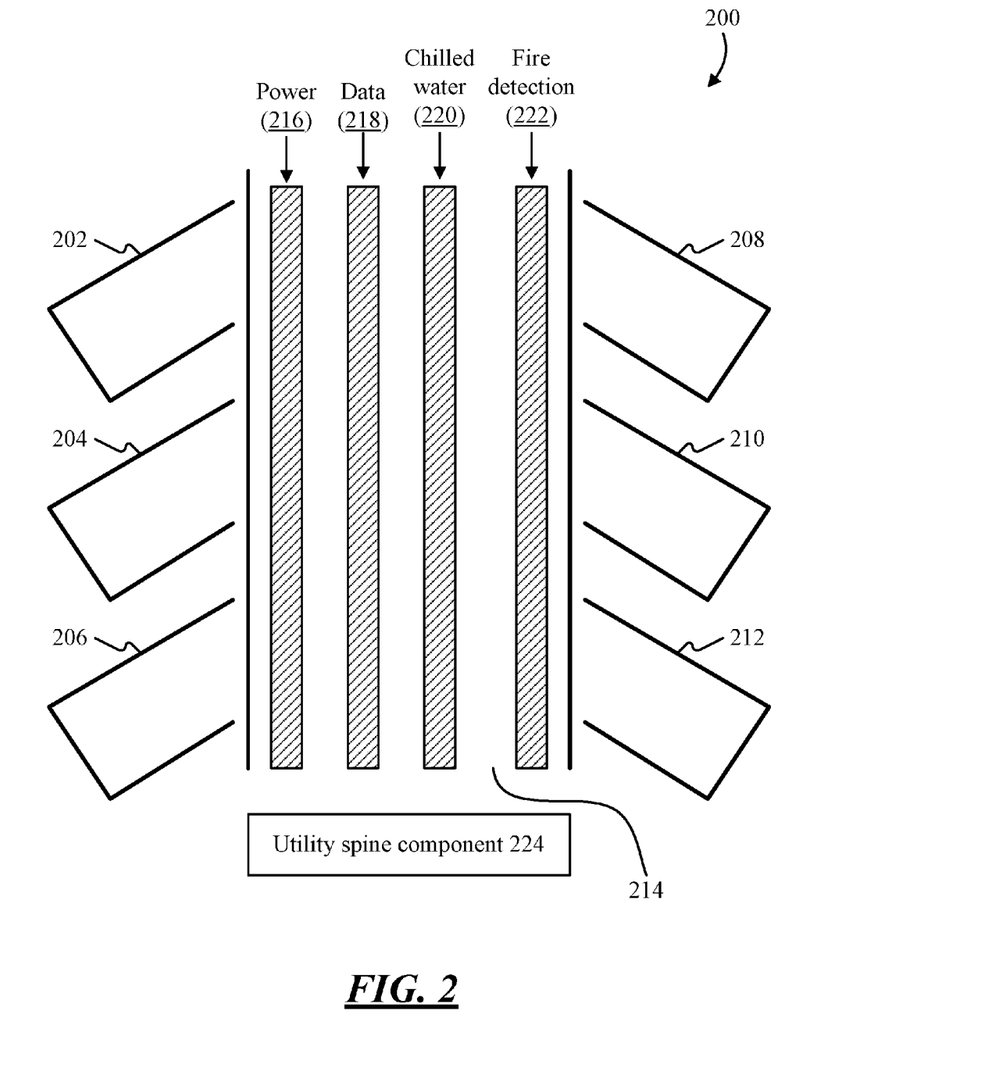
FIG. 2 is an elevation of an example data center, or of a portion of an example data center.

FIG. 2 shows an elevation of an example data center 200 (or a portion of an example data center 200). Data center 200 comprises a plurality of modules 202, 204, 206, 208, 210, and 212. Although six modules 202-212 are shown, data center 200 could have any number of modules. Modules 202-212 could be server modules, such as module 102 shown in FIG. 1. However, modules 202-212 could be any types of modules to implement any type of functionality, or could be a combination of different types of modules. For example, modules 202-206 might be server modules (or storage modules, or network modules, etc.), and modules 208-212 might be power modules (such as modules containing backup generators and/or UPSs to provide resistance to power service interruptions). (Although modules typically provide some type of functionality, to distinguish server modules from modules that provide other functionality, the description herein sometimes refers to "server modules" (the modules that add server capacity to the data center) and "function modules" (the modules that add various other capabilities like cooling, fire-protection, etc.).)

Data center 200 may also include a utility spine 214. Modules 202-212 may be connected to utility spine 214, thereby connecting modules 202-212 to each other and to the rest of data center 200. Utility spine 214 may provide various services to the modules that are connected to utility spine 214. For example, utility spine 214 may contain mechanisms to provide power 216, data 218, chilled water 220, communication related to fire detection 222. Or, utility spine 214 could provide any other types of services. In order to provide power, utility spine 214 may have one or more electrical cables, and several electrical interfaces to connect those cables to modules 202-212. As another example, utility spine 214 may have fiber to deliver data to modules 202-212. Utility spine could contain similar conduits for optional cooling media and/or fire protection communication. Thus, modules 202-212 may receive power 216, data 218, chilled water 220, communication related to fire detection 222, or other services, through utility spine 214.

Utility spine 214 may expose interfaces that allow modules 202-212 to connect to the various services provided by utility spine 214. Utility spine 214 may be extensible, so that utility spine 214 can become large enough to accommodate whatever size and/or capabilities data center 200 happens to have. For example, utility spine 214, as depicted in FIG. 2, is big enough to accommodate six modules 202-212. However, utility spine 214 could, itself, be modularized so that it can be extended to accommodate additional modules. Thus, utility spine 214 may be composed of several components, such as utility spine component 224. In order to extend utility spine 214 to allow it to accommodate additional modules, utility spine component 224 could be added to the existing utility spine. In general, the subject matter herein provides for the modularization of data center functionality, and utility spine capacity may be treated as simply one type of functionality that may be provided in the form of a module. In this way, utility spine capacity may be added to a data center simply by adding a utility spine component 224. (Conversely, utility spine 214 could be reducible in order to accommodate fewer modules. This reduction could be accomplished by removal of some instances of utility spine component 224.)

As noted above, modules may be combined in various ways. The different combinations may be used to affect the quantitative or qualitative capabilities of a data center. FIGS. 3-6 show various example combinations of modules that may be used to implement various types or amounts of data center functionality.

Figure 3:
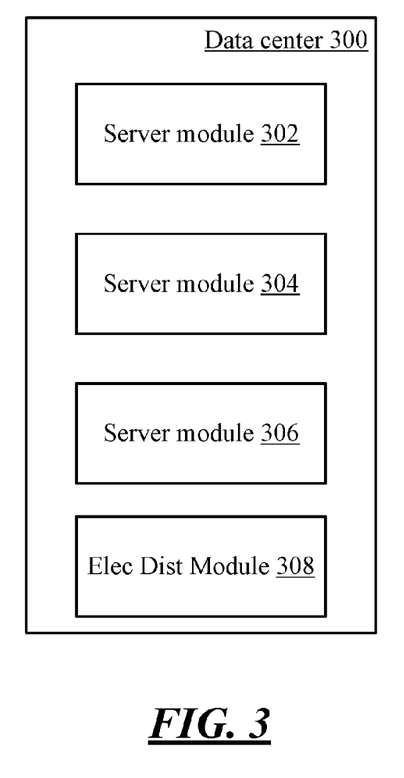
FIG. 3 is a block diagram of a first example combination of data center modules.

FIG. 3 shows a data center 300, which comprises a plurality of server modules 302, 304, and 306, and an electric distribution module 308 (which may all be connected by a utility spine, such as the one shown in FIG. 2). For example, it may have been determined that the amount of capacity that data center 300 is to supply can be provided with the amount of computing power offered by three server modules, and that these three server modules may be powered by electric distribution module 308. As noted above in connection with FIG. 1, a server module may include features such as cooling equipment, fire protection equipment, etc., and thus, the configuration of data center 300 shown in FIG. 3 may be able to provide basic resistance to high temperatures and fire. However, one may wish to upgrade data center 300 by providing additional capability. For example, the upgrade may give data center 300 an additional level rating, by providing some resistance to electrical failure.

Figure 4:
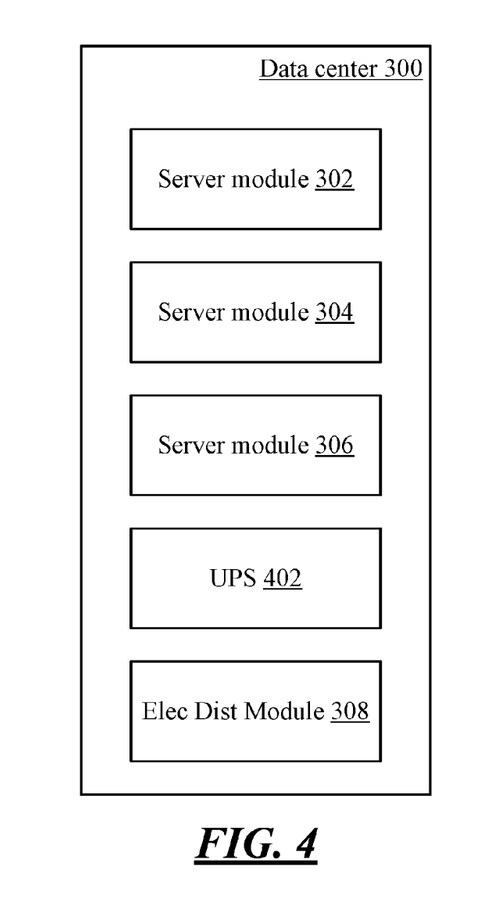
FIG. 4 is a block diagram of a second example combination of data center modules.

Thus, in the example of FIG. 4, data center 300 has server modules 302-306, plus Uninterruptable Power Supply (UPS) 402 (which may be connected to server modules 302-306, for example, by way of the utility spine shown in FIG. 2). UPS 402 may give data center 300 some resistance to electrical failure by allowing data center 300 to operate for some amount of time in the event that power ceased to be supplied to data center 300. It is noted that, in accordance with the subject matter described herein, UPS capacity is simply a feature that can be modularized, and that can be added to or removed from a data center to meet a particular (and possibly evolving) set of expectations for that data center. (Despite the term "uninterruptable power supply," it is possible that a UPS may cease to deliver power in situations such as battery failure, etc. Thus, devices that cease to deliver power for some reason may still be considered UPSs.)

Figure 5:
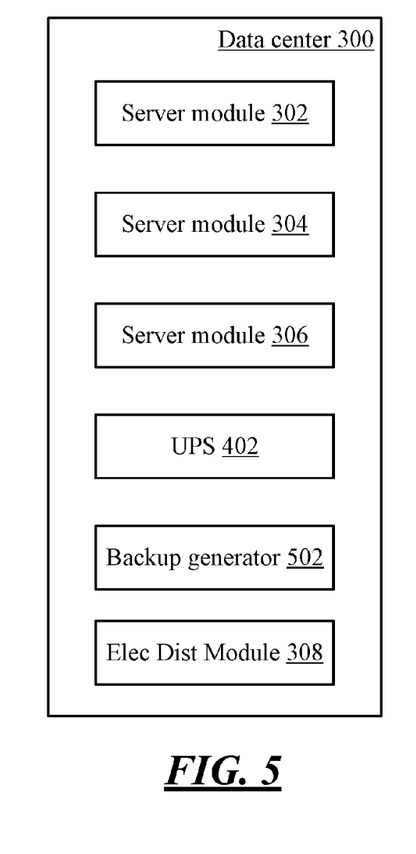
FIG. 5 is a block diagram of a third example combination of data center modules.

Similarly, data center 300's resistance to electrical failure may be upgraded, as shown in FIG. 5, by adding backup generator 502 to data center 300. Thus, in FIG. 5, data center 300 has server modules 302-306, UPS 402, and backup generator 502. Adding backup generator 502 to data center 300 may upgrade data center 300's resistance to electrical failure, and may result in an increase to the level rating of data center 300. (Backup generator 502 may be connected to the other components, for example, by the utility spine mentioned above.)

Figure 6:
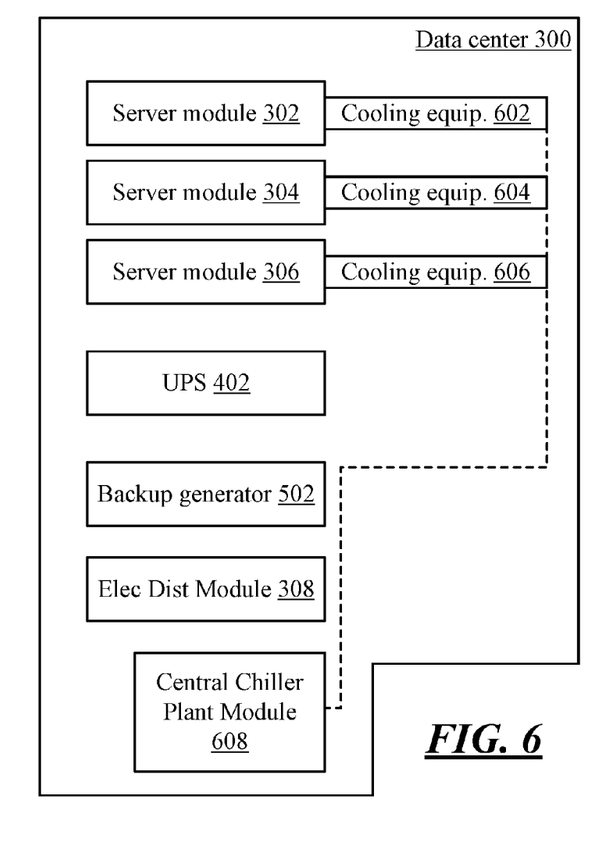
FIG. 6 is a block diagram of a fourth example combination of data center modules.

Finally, FIG. 6 shows, as an additional upgrade to data center 300, the addition of extra cooling equipment. For example, cooling equipment 602, 604, and 606 may be added to server modules 302, 304, and 306 respectively, in order to allow server modules to operate at higher temperatures—perhaps as a result of applying more power to the servers in server modules 302-306, perhaps as a result of operating those servers in a hotter climate. Cooling equipment 602-606 could be self-contained modules, or could use some chilling medium provided (e.g., through a utility spine) by a central chiller plant module 608. Additionally, FIG. 6 shows an example in which there is one piece of cooling equipment 602-606 for each of server modules 302-306, although the ratio of cooling equipment to server modules could be other than one to one. In accordance with the subject matter described herein, cooling is a function that may be modularized and added to a data center to meet some set of specifications for that data center. (The specifications might define, for example, the functional features that would be a part of a data center that meets some level of reliability.) While some types of functionality may be connected to a data center by attaching new components to a utility spine, FIG. 6 shows that some functionality may be added by attaching new modules to existing modules. For example, a cooling module could be a box of cooling equipment (e.g., condensers, fans, etc.), and that box could be attached to each of the modules that is to be cooled by the cooling equipment (server modules 302-306, in this example).

Figure 7:
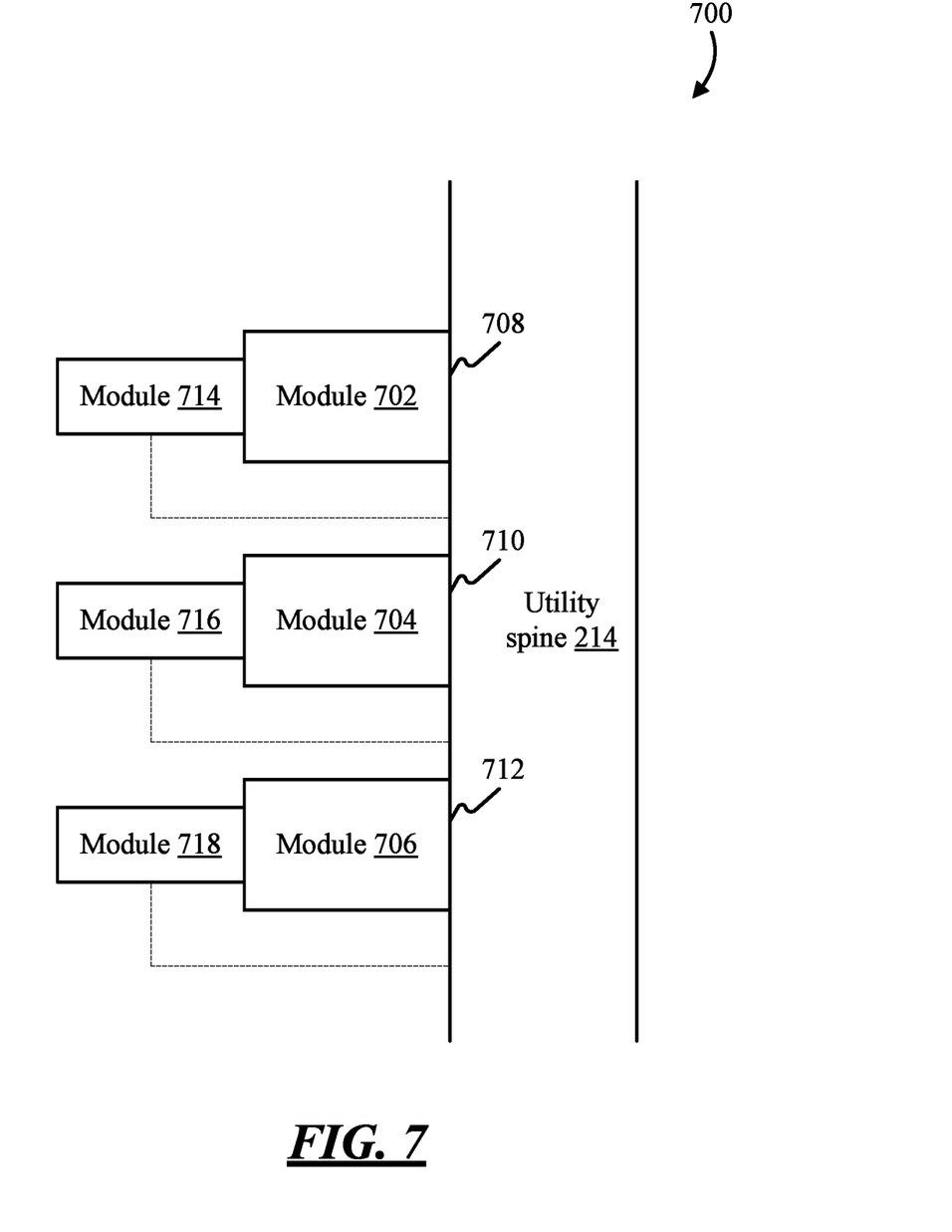
FIG. 7 is a block diagram of a data center, with modules that are added to the data center in various ways.

In general, new modules may be connectable to a data center either by connecting the new modules to a utility spine that serves the data center, or by connecting the new modules to other modules, or both connecting to the spine and another module. As shown in FIG. 7, a data center 700 may have a utility spine 214, and a plurality of modules 702, 704, and 706 may be connected to that utility spine. The connections to utility spine 214 may be made through interfaces 708, 710, and 712, respectively, which may take any form.

Modules 714, 716, and 718 may be connectable to data center 700 by attaching them to existing modules 702-706 rather than by attaching them to utility spine 214. In general, the way to add a module depends on the type of functionality that the module is to provide. For example, a cooling module may operate by being in proximity to the component that it is going to cool, so it makes sense to add a cooling module by attaching it to the module to be cooled rather than by attaching it to a utility spine. Some cooling modules may also be connected to both a component being cooled as well as to a modular central cooling system via the utility spine. On the other hand, some types of electrical components may work by adding capacity or backup capacity to several components of the data center and thus, to allow the power they provide to flow through the data center, these components may be connected to the utility spine. However, the subject matter herein applies to modules that implement various functionalities, regardless of how or where those modules are connected to a data center.

Figure 8:
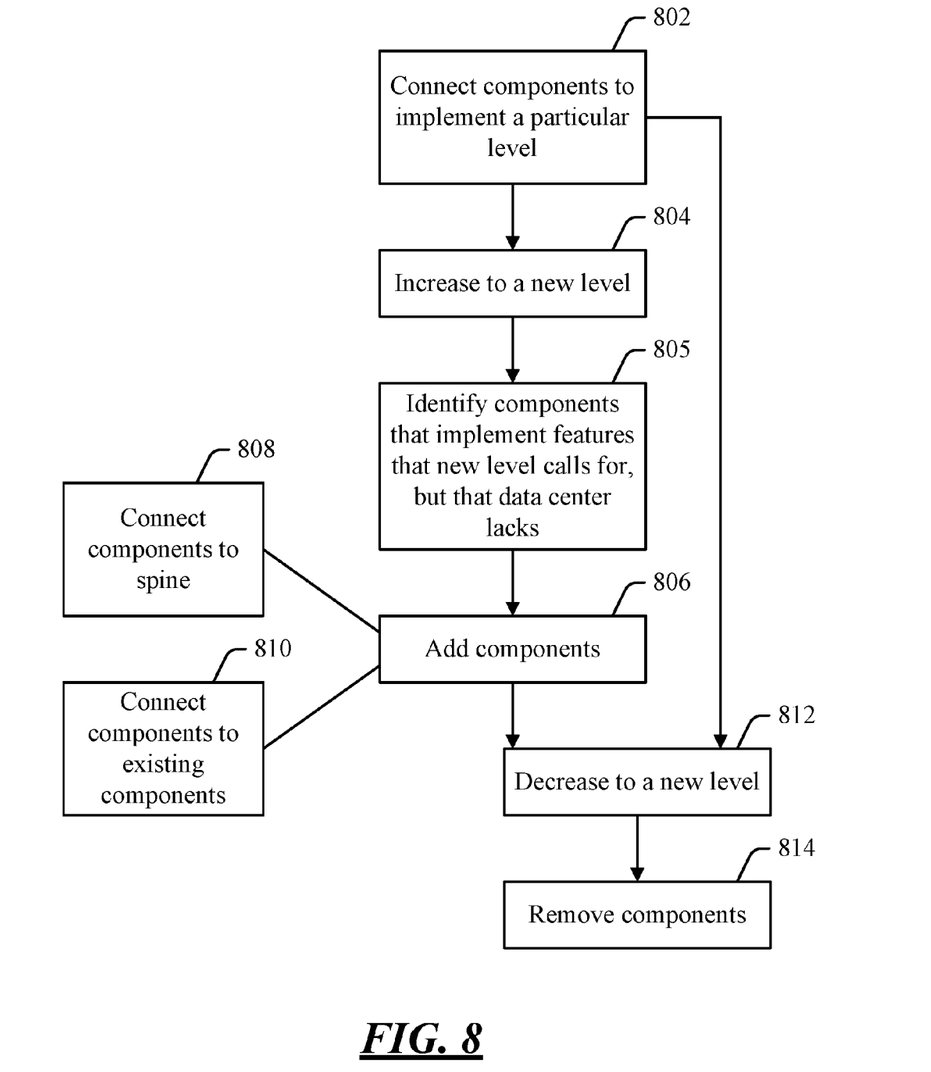
FIG. 8 is a flow diagram of an example process in which components may be added or removed in order to increase or decrease the functionality of a data center.

FIG. 8 shows, in the form of a flow diagram, an example process (or method) in which components may be added (or removed) in order to increase (or decrease) the functionality of a data center. In the example of FIG. 8, data centers may meet specifications for various levels, and the addition (or subtraction) of functionality may take a data center up (or down) a level.

At 802, components are connected together in a data center, in order to implement a data center at a particular level. For example, there might be specifications that define levels A, B, and C for data centers, and, at 802, the components may be connected so as to create a level A data center.

At 804, a process is initiated to increase the data center to a new level. For example, the owners of the data center may wish to upgrade it from a level A data center to a level B data center. Thus, at 805, components may be chosen or identified that would implement new features called for by level B, but that the data center presently lacks (or that the data center lacks as much of as called for by the specification). E.g., level B might call for cooling capacity, and the data center, at present, might have no cooling capacity, or might have some cooling capacity but not as much as the specification of level B calls for. Then, at 806, components are added to the data center in order to give the data center the additional functionality that would upgrade its rating from level A to level B. As discussed above, components may be added to the data center by connecting those new components to a utility spine that runs through the data center (at 808), or by connecting the new components to existing components (at 810).

At 812, a decision may be made to decrease the data center to a different level. (This decision may be made after a prior increase in the level; or it may be the case that there was no prior in increase in the level, in which case 804-806 may not have occurred.) For example, after the data center has become a level B data center, it may be determined that a level A data center would suit the purposes of the data center's owners. Thus, at 814, components may be removed from the data center in order to remove functionalities associated with a level B data center. Once those components (and, therefore, the functionalities that they implement) are removed from the data center, the data center is downgraded to the previous level.

Figure 9:
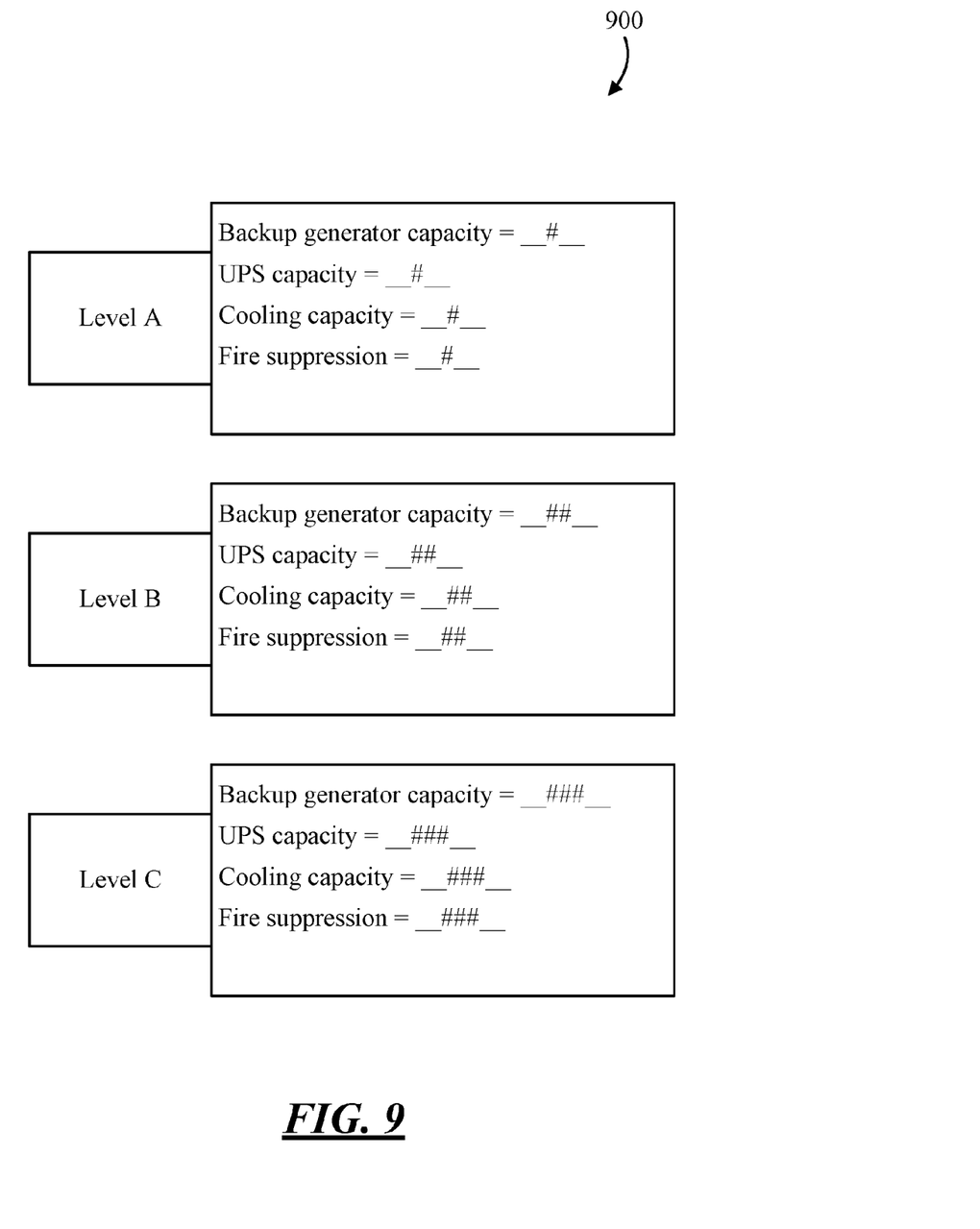
FIG. 9 is a block diagram of some example specifications for various level ratings.

As the process of FIG. 8 demonstrates, modularization of functionalities into distinct components, and the ability to add or take away these functionalities, allows data centers to be upgraded and/or downgraded in order to meet the particular performance and/or reliability standard that the data center is expected to meet at a particular point in time. FIG. 9 shows some example specifications that may be met (or un-met) by upgrading (or downgrading) a data center's capacity.

FIG. 9 shows a specification 900 that defines three levels: A, B, and C. The specification for each level defines various types of characteristics that a data center of that level would possess in order to meet the standards for that level. Specifically, in the example of FIG. 9, each level has specific parameters for its backup generator capacity, its UPS capacity, its cooling capacity, and its fire protection capacity. These parameters may be different for the different levels (as indicated pictorially by the different numbers of hash-mark symbols for the various parameters at each level). As discussed above, functionality may be added or taken away through modules in order to allow a data center to meet the parameters specified for a particular level. The parameters shown in FIG. 9 are merely examples of parameters that could be used to define the different levels. Other types of parameters (e.g., data throughput, earthquake resistance, etc.) could be used to define the standards that define whether a data center qualifies as being at a certain level.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A data center comprising:
a component that supplies electrical power, data connectivity, and cooling media, and that exposes a plurality of interfaces that are configured for connecting one or more function modules to said component;
a plurality of server modules that are connected to the component through the interfaces, each of said server modules comprising one or more racks of servers, each of said server modules receiving said electric power, said data connectivity, and said cooling media through one of the plurality of interfaces through which said individual server modules is connected to said component; and
one or more of said function modules, each of the function modules implementing a function that provides a capability to the data center, each of the function modules being connected to the data center by: (a) being attached to one of said server modules; or (b) being attached to another one of the function modules; or (c) being attached to said component, said one or more function modules including one or more first function modules and one or more second function modules, each of said first function modules comprising electrical wires configured to carry said electrical power, data fiber configured to carry said data connectivity, and conduits configured to carry said cooling media, said component being composed of said one or more first function modules, said component being extensible to accommodate an additional number of said second function modules by addition of one of said one or more of first function modules, and being reducible to accommodate a fewer number of said second function modules by removal of said one of said one or more first function modules.

2. The data center of claim 1, wherein one of said second function modules implements a cooling function, said one of said second function modules being attached to one of said server modules.

3. The data center of claim 1, wherein one of said second function modules implements a fire protection function.

4. The data center of claim 1, wherein one of said second function modules comprises a backup generator, said backup generator being attached to said data center through said component.

5. The data center of claim 1, wherein one of said second function modules comprises an uninterruptable power supply.

6. The data center of claim 1, wherein each of said server modules and said function modules are pre-fabricated away from a site at which said data center is located, wherein said server modules comprise shipping containers in which said one or more racks of servers are installed.

7. The data center of claim 1, wherein a specification defines functional capabilities that are possessed by said data center that meets a reliability level, and wherein said function modules are chosen to allow said data center to satisfy said specification.

8. The data center of claim 1, each of said one or more first function modules comprising a fire detection communication line.

9. An apparatus comprising:
a component that supplies electrical power, data connectivity, and cooling media, and that exposes a plurality of interfaces through which one or more function modules are connectable to said component;
a plurality of server modules that are connected to the component through the interfaces, each of said server modules comprising one or more racks of servers, each of said server modules receiving said electric power, said data connectivity, and said cooling media through one of the plurality of interfaces through which said individual server modules is connected to said component; and
one or more of said function modules, each of the function modules implementing a function that provides a capability to the apparatus, each of said one or more said function modules comprising:
one or more first function modules and one or more second function modules, said component being composed of said one or more first function modules, each of said one or more first function modules comprising electrical wires configured to carry said electrical power, data fiber configured to carry said data connectivity, and conduits configured to carry said cooling media, said component being extensible to accommodate an additional number of said second function modules by addition of one of said one or more first function modules, and being reducible to accommodate a fewer number of said second function modules by removal of one of said one or more first function modules; and
a cooling module for cooling said cooling media provided to said conduits, the cooling module being one of the second function modules.

10. The apparatus of claim 9, each of said one or more function modules comprising a separate shipping container.

11. The apparatus of claim 9, wherein one of said second function modules comprises a backup generator, said backup generator being attached to said apparatus through said component.

12. The apparatus of claim 9, wherein one of said second function modules comprises an uninterruptable power supply.

13. The apparatus of claim 9, wherein each of said server modules and said function modules are pre-fabricated away from a site at which said apparatus is located.

14. The apparatus of claim 9, said apparatus comprising a data center.

15. A system comprising:
a component that supplies electrical power, data connectivity, and cooling media, and that exposes a plurality of interfaces through which one or more function modules are connectable to said component, said plurality of function modules including one or more first function modules and one or more second function modules, said component being composed of said one or more first function modules, each of said first function modules comprising electrical wires configured to carry said electrical power, data fiber configured to carry said data connectivity, and conduits configured to carry said cooling media, said component being extensible to accommodate an additional number of said second function modules by addition of one of said one or more first function modules, and being reducible to accommodate a fewer number of said second function modules by removal of said one of said one of more first function modules, said component being connected to one or more server modules that contain servers and that receive said electrical power, said data connectivity, and said cooling media through one of the plurality of interfaces through which each of the one or more server modules is connected to said component.

16. The system of claim 15, each of said function modules comprising a separate shipping container.

17. The system of claim 15, further comprising:
one of said second function modules comprises a backup generator, said backup generator being attached to said system through said component.

18. The system of claim 15, wherein each of said one or more server modules and said function modules are prefabricated away from a site at which said system is located.

19. The system of claim 15, said system comprising a data center.

20. The system of claim 15, each of said one or more first function modules comprising a fire detection communication line.

\* \* \* \* \*